US010355648B2

(12) United States Patent
Ueda

(10) Patent No.: US 10,355,648 B2
(45) Date of Patent: Jul. 16, 2019

(54) REGULATOR AMPLIFIER CIRCUIT FOR OUTPUTTING A FIXED OUTPUT VOLTAGE INDEPENDENT OF A LOAD CURRENT

(71) Applicants: Kabushiki Kaisha Toshiba, Minato-ku, Tokyo (JP); Toshiba Electronic Devices & Storage Corporation, Minato-ku, Tokyo (JP)

(72) Inventor: Norihiro Ueda, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/910,152

(22) Filed: Mar. 2, 2018

(65) Prior Publication Data

US 2019/0089313 A1    Mar. 21, 2019

(30) Foreign Application Priority Data

Sep. 20, 2017    (JP) .................................. 2017-180530

(51) Int. Cl.
*G05F 1/575*    (2006.01)
*H03F 1/08*    (2006.01)
(Continued)

(52) U.S. Cl.
CPC ........... *H03F 1/086* (2013.01); *H03F 1/0205* (2013.01); *H03F 3/45273* (2013.01);
(Continued)

(58) Field of Classification Search
CPC .... H03F 1/086; H03F 1/0205; H03F 3/45273; H03F 2200/366; H03F 2203/45631;
(Continued)

(56) References Cited

U.S. PATENT DOCUMENTS

| 6,356,064 B1* | 3/2002 | Tonda ........................ G05F 3/30 |
| | | 323/313 |
| 2003/0011351 A1* | 1/2003 | Shim ........................ G05F 3/245 |
| | | 323/316 |

(Continued)

FOREIGN PATENT DOCUMENTS

| JP | 2001-147725 A | 5/2001 |
| JP | 5057358 B2 | 10/2012 |
| JP | 2014-160332 A | 9/2014 |

*Primary Examiner* — Adolf D Berhane
*Assistant Examiner* — Jye-June Lee
(74) *Attorney, Agent, or Firm* — White & Case LLP

(57) ABSTRACT

A regulator amplifier circuit of an embodiment includes a differential amplifier circuit, an nMOS transistor, and a pMOS transistor. The differential amplifier circuit includes a differential circuit and a transistor. The differential circuit includes a differential MOS transistor circuit, and the transistor includes a gate voltage controlled by the differential circuit. The nMOS transistor includes a drain connected to a drain on minus side of the differential MOS transistor, and a gate connected to a source of the transistor. The nMOS transistor operates in a weak inversion region. The pMOS transistor includes a source connected to a source of the nMOS transistor, and a drain connected to a voltage lower than a source voltage of the nMOS transistor. The pMOS transistor operates in the weak inversion region.

10 Claims, 5 Drawing Sheets

(51) Int. Cl.
   *H03F 3/45* (2006.01)
   *H03F 1/02* (2006.01)
   *G05F 3/24* (2006.01)

(52) U.S. Cl.
   CPC .............. *G05F 1/575* (2013.01); *G05F 3/247* (2013.01); *H03F 2200/366* (2013.01); *H03F 2203/45631* (2013.01)

(58) Field of Classification Search
   CPC .......... G05F 1/462; G05F 1/575; G05F 3/242; G05F 3/247; G05F 3/16
   See application file for complete search history.

(56) References Cited

U.S. PATENT DOCUMENTS

| | | | | |
|---|---|---|---|---|
| 2006/0232326 A1* | 10/2006 | Seitz | ........................ | G05F 3/30 327/539 |
| 2008/0258816 A1* | 10/2008 | Hsu | .................... | H03F 3/45183 330/277 |
| 2014/0232363 A1 | 8/2014 | Ueda | | |

\* cited by examiner

FIG. 1
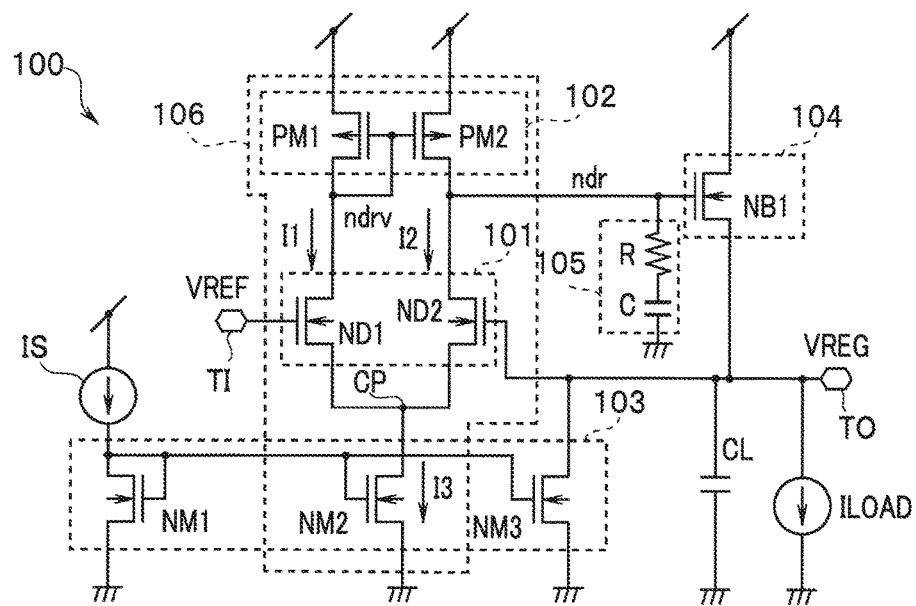
FIG. 2A
FIG. 2B
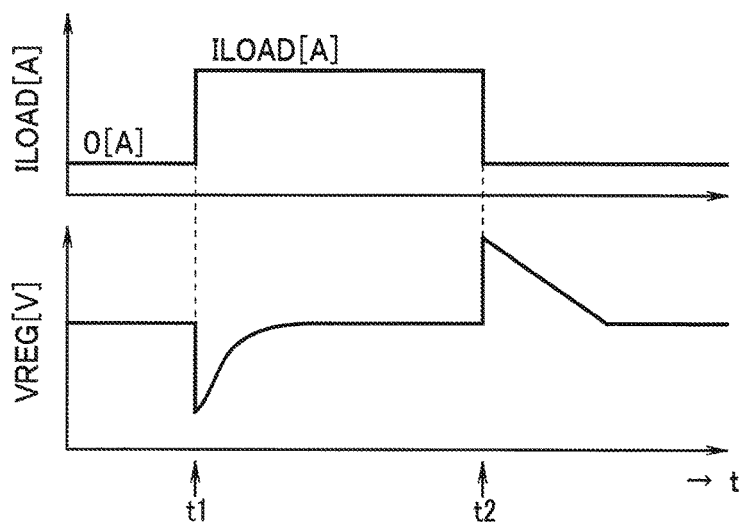

FIG. 4
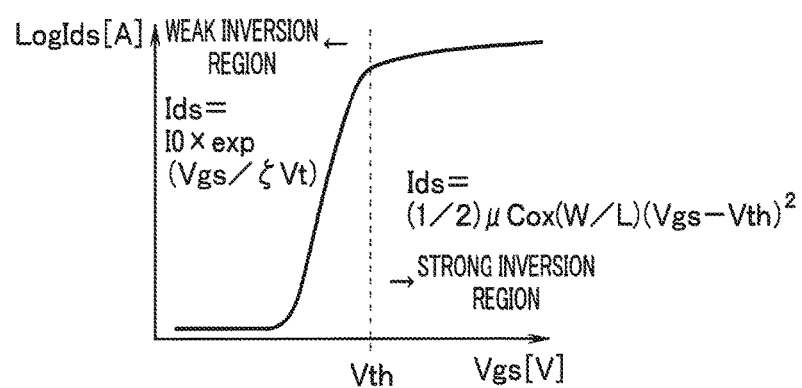
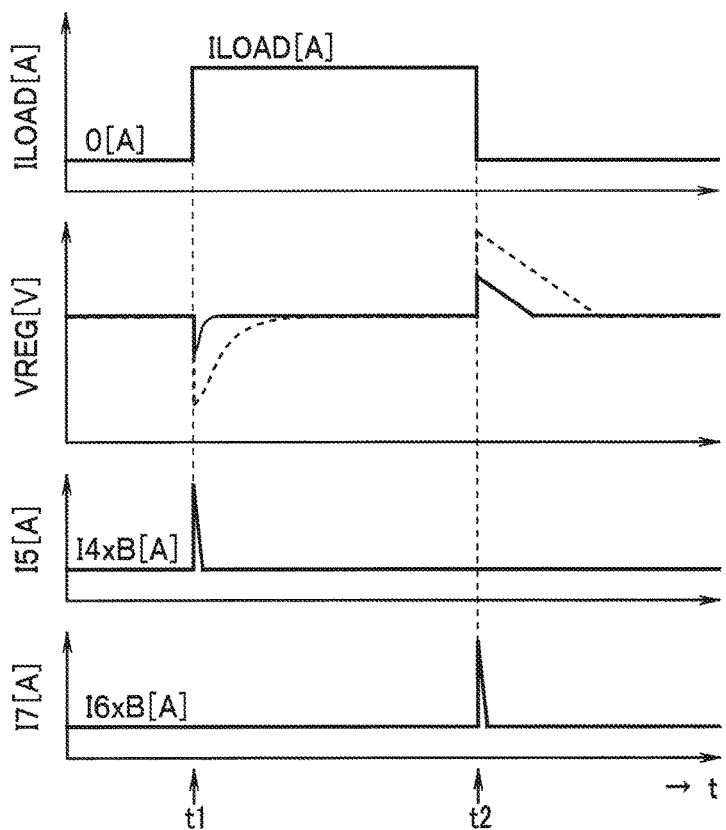
FIG. 5A
FIG. 5B
FIG. 5C
FIG. 5D

REGULATOR AMPLIFIER CIRCUIT FOR OUTPUTTING A FIXED OUTPUT VOLTAGE INDEPENDENT OF A LOAD CURRENT

CROSS-REFERENCE TO RELATED APPLICATIONS

This application is based upon and claims the benefit of priority from the prior Japanese Patent Application No. 2017-180530 filed in Japan on Sep. 20, 2017; the entire contents of which are incorporated herein by reference.

FIELD

Embodiments described herein relate to a regulator amplifier circuit that outputs a fixed output voltage to a reference voltage.

BACKGROUND

An existing regulator amplifier circuit includes a differential circuit to cause an output voltage to be coincident with a reference voltage.

In the regulator amplifier circuit, feedback is applied to the differential circuit to control a gate voltage of an output transistor according to a load current flowing through a load circuit, in order to output a fixed output voltage to an output terminal independent of the load current.

The regulator amplifier circuit preferably quickly responds (has high slew rate) to steep variation of the load current; however, it is necessary to cause a large amount of current to constantly flow through the differential circuit in order to obtain quick response in a case where a gate capacitance of the output transistor is large.

BRIEF DESCRIPTION OF THE DRAWINGS

FIG. 1 is a circuit diagram illustrating a regulator amplifier circuit relating to a regulator amplifier circuit of an embodiment;

FIGS. 2A and 2B are graphs illustrating step response of a load current ILOAD of a regulator amplifier circuit 100 in FIG. 1;

FIG. 4 is a graph to explain operation of a transistor in a weak inversion region;

FIGS. 5A to 5D are graphs illustrating variation of an output voltage VREG, a current I5, and a current I7 with respect to step response of a load current ILOAD of the regulator amplifier circuit 1 according to the embodiment;

DETAILED DESCRIPTION

Figure 3:
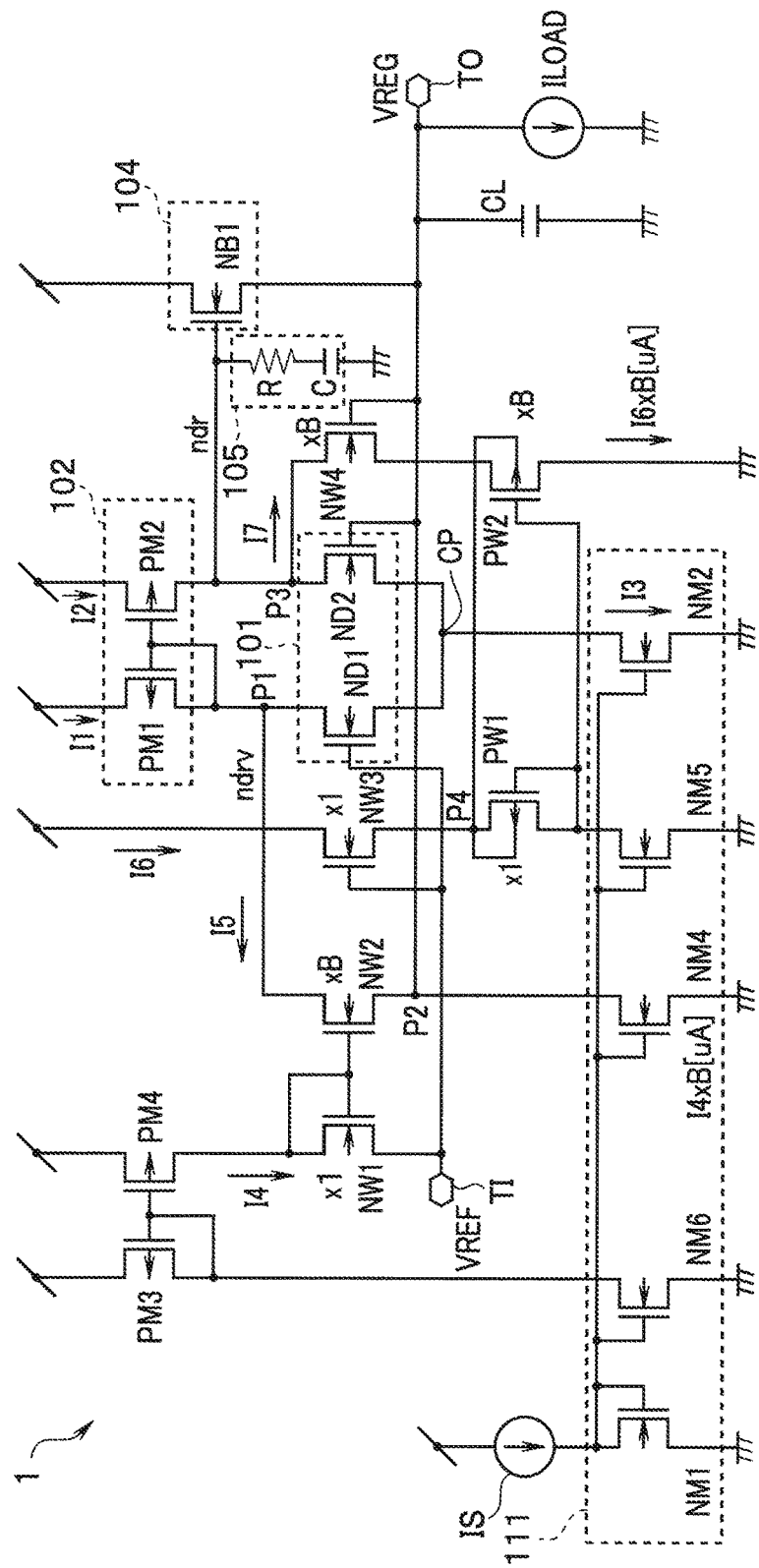
FIG. 3 is a circuit diagram of a regulator amplifier circuit 1 according to the embodiment.

A regulator amplifier circuit of an embodiment includes a differential amplifier circuit, a fourth nMOS transistor, a second constant current circuit, a fifth nMOS transistor, and a first pMOS transistor. The differential amplifier circuit includes a differential circuit and a third nMOS transistor, and is configured to cause a source potential of the third nMOS transistor to be fed back to minus side of a differential MOS transistor circuit. The differential circuit includes the differential MOS transistor circuit, a first current mirror circuit, and a first constant current circuit. The differential MOS transistor circuit includes first and second nMOS transistors. The first current mirror circuit is connected to each drain of the first and second nMOS transistors. The first constant current circuit is connected to a common source of the first and second nMOS transistors. The third nMOS transistor includes a gate voltage controlled by the differential circuit. The fourth nMOS transistor includes a drain connected to a drain on plus side of the differential MOS transistor circuit, and a source connected to a source of the third nMOS transistor, and the fourth nMOS transistor operates in a weak inversion region. The second constant current circuit is connected to the fourth nMOS transistor to cause a source voltage of the fourth nMOS transistor to be equal to or substantially equal to a gate voltage on the plus side of the differential MOS transistor circuit. The fifth nMOS transistor includes a drain connected to a drain on the minus side of the differential MOS transistor circuit, and a gate connected to the source of the third nMOS transistor, and the fifth nMOS transistor operates in the weak inversion region. The first pMOS transistor includes a source connected to a source of the fifth nMOS transistor, and a drain connected to a voltage lower than a source voltage of the fifth nMOS transistor, and the first pMOS transistor operates in the weak inversion region.

In the following, the embodiment is described with reference to drawings.

(Configuration)

First, a regulator amplifier circuit relating to the regulator amplifier circuit of the present embodiment is described.

FIG. 1 is a circuit diagram of the regulator amplifier circuit relating to the regulator amplifier circuit of the present embodiment.

A regulator amplifier circuit 100 is of a source follower type using an nMOS transistor, and includes two transistors ND1 and ND2 configuring a differential MOS transistor circuit 101, two transistors PM1 and PM2 configuring an active current mirror circuit 102, three transistors NM1, NM2, and NM3 configuring a current mirror circuit 103, a transistor NB1 configuring an output transistor 104, and a resistor R and a capacitor C configuring a phase compensation circuit 105.

Each of the transistors ND1, ND2, NM1, NM2, NM3, and NB1 is an nMOS transistor including an n-type channel, and each of the transistors PM1 and PM2 is a pMOS transistor including a p-type channel.

The differential MOS transistor circuit 101 includes the two nMOS transistors ND1 and ND2, and generates a comparison signal corresponding to a voltage difference between a reference voltage VREF supplied to an input terminal TI and an output voltage VREG outputted from an output terminal TO. The nMOS transistor ND1 is a transistor on plus side of the differential MOS transistor circuit 101, and the nMOS transistor ND2 is a transistor on minus side of the differential MOS transistor circuit 101.

Sources of the respective transistors ND1 and ND2 are connected in common, and a gate of the transistor ND1 is connected to the input terminal TI. The reference voltage VREF is provided to the gate of the transistor ND1 from outside. A gate of the transistor ND2 is connected to the output terminal TO. The output voltage VREG is provided to the gate of the transistor ND2.

The active current mirror circuit 102 is connected to each drain of the transistors ND1 and ND2. More specifically, a drain of the transistor PM1 is connected to the drain of the transistor ND1, and a drain of the transistor PM2 is connected to the drain of the transistor ND2.

Gates of the respective transistors PM1 and PM2 are connected to the drain of the transistor PM1. The drain of the transistor PM2 is connected to a gate of the transistor NB1. Accordingly, a gate voltage of the transistor NB1 is controlled by a differential circuit 106.

Further, the phase compensation circuit 105 that includes the resistor R and the condenser C and prevents oscillation caused by feedback to the differential MOS transistor circuit 101 is connected to the gate of the transistor NB1.

A source of the transistor NB1 is connected to the output terminal TO. A source potential of the transistor NB1 is fed back to the minus side (gate of transistor ND2) of the differential MOS transistor circuit 101.

Each gate of the transistors NM1, NM2, and NM3 of the current mirror circuit 103 is connected to a drain of the transistor NM1 and a current source IS. Each source of the transistors NM1, NM2, and NM3 is connected to a ground potential. A drain of the transistor NM2 is connected to a connection point CP at which the sources of the respective transistors ND1 and ND2 are connected to each other. The transistor NM2 configures a constant current circuit connected to the common source of the transistors ND1 and ND2.

A drain of the transistor NM3 is connected to the output terminal TO. A fixed current constantly flows through the transistor NM3 that has the drain connected to the output terminal TO.

A current flowing through the transistor ND1 is denoted by I1, a current flowing through the transistor ND2 and the transistor PM2 is denoted by I2, and a current flowing from the connection point CP to the current mirror circuit 103 is denoted by I3. The currents I1, I2, and I3 have relationship of I3=I1+I2.

In FIG. 1, a reference sign ILOAD denotes a load current and a reference sign CL denotes a load capacitance.

As described above, the regulator amplifier circuit 100 in FIG. 1 is a differential amplifier circuit that includes the differential circuit 106 and the transistor NB1 as the nMOS transistor. The differential circuit 106 includes the differential MOS transistor circuit 101 that includes the two nMOS transistors ND1 and ND2, the current mirror circuit 102 connected to each drain of the transistors ND1 and ND2 of the differential MOS transistor circuit 101, and the constant current circuit that includes the transistor NM2 connected to the common source of the transistors ND1 and ND2. The gate voltage of the transistor NB1 serving as the output transistor is controlled by the differential circuit 106. In the regulator amplifier circuit 100, the source potential of the transistor NB1 is fed back to the minus side (i.e., gate of transistor ND2) of the differential MOS transistor circuit 101.

Next, operation of the regulator amplifier circuit 100 is described.

A fixed reference voltage VREF of, for example, 1.2 V (volt) is provided to the gate of the transistor ND1 from the outside. The output voltage VREG is fed back to the differential MOS transistor circuit 101. Therefore, the regulator amplifier circuit 100 operates so as to output the fixed output voltage VREG of, for example, 1.2 V even if the load current ILOAD is varied when the regulator amplifier circuit 100 is in a stationary load state.

In a case where the load current ILOAD is drastically increased, however, the output voltage VREG is temporarily lowered. This lowers the gate voltage of the transistor ND2 and decreases the current I2. As a result, the current I1 is increased to result in a difference between the current I1 and the current I2 flowing through a differential path.

The increase of the current I1 lowers a drain voltage of the transistor PM1, and as a result, a gate voltage ndrv of the transistor PM2 of the active current mirror circuit 102 is also lowered.

When the gate voltage ndrv of the transistor PM2 is lowered, a gate-source voltage Vgs of the transistor PM2 becomes large, the current flowing through the transistor PM2 is increased, and a gate voltage ndr of the transistor NB1 is raised. As a result, the gate-source voltage Vgs of the transistor NB1 becomes high, which increases the current flowing through the transistor NB1.

Accordingly, when the load current is drastically increased and the output voltage VREG of the output terminal TO is lowered, the regulator amplifier circuit 100 operates so as to increase the current flowing through the transistor NB1 and to return the output voltage VREG to the predetermined voltage, for example, 1.2 V.

In contrast, in a case where the load current ILOAD is drastically decreased and the output voltage VREG is raised, the gate voltage of the transistor ND2 is raised and the current I2 is increased. The increase of the current I2 lowers a drain voltage of the transistor PM2, which lowers the gate voltage ndr of the transistor NB1. As a result, the gate-source voltage Vgs of the transistor NB1 is also decreased, which decreases the current flowing through the transistor NB1.

Accordingly, when the load current is drastically decreased and the output voltage VREG of the output terminal TO is raised, the regulator amplifier circuit 100 operates so as to decrease the current flowing through the transistor. NB1 and to return the output voltage VREG to the predetermined voltage, for example, 1.2 V.

As described above, the regulator amplifier circuit 100 controls the gate voltage ndr according to the load current ILOAD.

The transistor NB1, however, typically has a large size for supply of a large current to the load and also has a large gate capacitance.

Therefore, in a case where the gate capacitance of the transistor NB1 is large, when the load current ILOAD is steeply varied, a time necessary for increasing or decreasing the gate voltage of the transistor NB1, namely, a period necessary for charging the gate capacitance becomes long, which makes response (slew rate) of the gate voltage ndr of the transistor NB1 slow.

FIGS. 2A and 2B are graphs illustrating step response of the load current ILOAD of the regulator amplifier circuit 100 of FIG. 1. An upper graph illustrates variation of the load current ILOAD as illustrated in FIG. 2A, and a lower graph illustrates variation of the output voltage VREG as illustrated in FIG. 2B.

When the load current ILOAD is drastically increased at time t1, the output voltage VREG is lowered once, and is then gradually raised to return to the predetermined voltage. In addition, when the load current ILOAD is drastically decreased at time t2, the output voltage VREG is raised once, and is then gradually lowered to return to the predetermined voltage. The voltage variation of the output voltage VREG becomes larger and time necessary for returning to the predetermined voltage becomes longer as the current variation of the load current ILOAD is larger.

Typically, to cause the output voltage VREG to return to the predetermined voltage in a short time in the case where the gate capacitance of the transistor NB1 is large, it is necessary to increase an amount of the current I3 flowing through the differential MOS transistor circuit 101.

FIG. 3 is a circuit diagram of a regulator amplifier circuit 1 according to the present embodiment. The regulator amplifier circuit 1 is provided as a semiconductor integrated circuit in a semiconductor device, and the semiconductor device is mounted on various kinds of electronic apparatuses.

In FIG. 3, the components same as the components of the regulator amplifier circuit 100 of FIG. 1 are denoted by the same reference numerals, and description of such components is simplified.

The regulator amplifier circuit 1 according to the present embodiment includes transistors NW1, NW2, NW3, NW4, PW1, and PW2. Each of the transistors NW1, NW2, NW3, and NW4 is an nMOS transistor. Each of the transistors PW1 and PW2 is a pMOS transistor.

The regulator amplifier circuit 1 further includes a current mirror circuit 111 that includes transistors NM1, NM2, NM4, NM5, and NM6. Each of the transistors NM1, NM2, NM4, NMS, and NM6 is an nMOS transistor.

The regulator amplifier circuit 1 includes two transistors PM3 and PM4 configuring a current mirror circuit. Each of the transistors PM3 and PM4 is a pMOS transistor.

A drain of the transistor PM3 is connected to a drain of the transistor NM6 of the current mirror circuit 111.

A source of the transistor NW1 is connected to the input terminal TI, and a drain of the transistor PM4 is connected to a drain of the transistor NW1. The drain and a gate of the transistor NW1 are connected to each other. The transistor NW1 allows a current I4 to flow through the transistor NW1.

A drain of the transistor NW2 is connected to a connection point P1 of the transistors PM1 and ND1. The drain of the transistor NW2 is connected to a drain (i.e., drain of transistor ND1) on plus side of the differential MOS transistor circuit 101, and a source of the transistor NW2 is connected to a source of the transistor NB1. The transistor NW2 operates in a weak inversion region.

Further, the source of the transistor NW2 is connected to the output terminal TO and a gate of the transistor ND2. Gates of the respective transistors NW1 and NW2 are connected to each other.

The current I4 is set to allow the transistors NW1 and NW2 to operate in the weak inversion region. Since the gates of the transistors NW1 and NW2 are connected to each other, current density of the transistor NW1 and current density of the transistor NW2 are equal to each other when the voltage at the input terminal TI to which the source of the transistor NW1 is connected and the voltage at the output terminal TO to which the source of the transistor NW2 is connected are equal to each other. The current density indicates an amount of flowing current per unit area in one transistor.

A drain of the transistor NM4 is connected to the source of the transistor NW2. A connection point P2 of the transistor NM4 and the transistor NW2 is connected to the output terminal TO. The transistor NM4 configures a constant current circuit connected to the transistor NW2 such that a source voltage of the transistor NW2 becomes equal to or substantially equal to a gate voltage on the plus side of the differential MOS transistor circuit 101.

Further, the transistors NW1 and NW2 have transistor size ratio such that a current I5 flowing though the transistor NW2 becomes B times the current I4 flowing through the transistor NW1 when the reference voltage VREF and the output voltage VREG are equal to each other. In FIG. 3, "×1" and "×B" indicate two transistor size ratios. The current density of the transistor NW1 and the current density of the transistor NW2 are equal to each other. Therefore, the current I5 becomes B times the current I4.

A source of the transistor NW3 and a source of the transistor PW1 are connected to each other. A gate of the transistor NW3 is connected to the input terminal TI. A drain of the transistor PW1 is connected to a drain of the transistor NM5 of the current mirror circuit 111. A gate and the drain of the transistor PW1 are connected to each other.

A source of the transistor NW4 and a source of the transistor PW2 are connected to each other. A drain of the transistor NW4 is connected to a connection point P3 of the transistors PM2 and ND2. A gate of the transistor NW4 is connected to the source of the transistor NB1 and the output terminal TO. In other words, the drain of the transistor NW4 is connected to the drain (i.e., drain of transistor ND2) on the minus side of the differential MOS transistor circuit 101, and the gate of the transistor NW4 is connected to the source of the transistor NB1. The transistor NW4 operates in the weak inversion region.

Gates of the respective transistors PW1 and PW2 are connected to each other.

When gate voltages of the respective transistors NW3 and NW4 are equal to each other and the current densities of the respective transistors NW3 and NW4 are equal to each other, source voltages of the respective transistors NW3 and NW4 become the same potential. In other words, the transistors PW1 and PW2 configure a current mirror circuit. In this case, a body of the transistor PW1 and a body of the transistor PW2 are connected to a connection point P4 at which the sources of the respective transistors NW3 and PW1 are connected to each other. The source of the transistor PW2 is connected to the source of the transistor NW4, and a drain of the transistor PW2 is connected to a voltage (in this case, ground potential) lower than the source voltage of the nMOS transistor NW4. The transistor PW2 operates in the weak inversion region.

Accordingly, the current I6 is set so as to allow the transistors NW3 and NW4 and the transistors PW1 and PW2 to operate in the weak inversion region. When the reference voltage VREF and the output voltage VREG are equal to each other, the sources of the transistors NW3 and NW4 have the same potential, and the transistors NW3 and NW4 and the transistors PW1 and PW2 have the size ratio such that a current I7 flowing through the transistors NW4 and PW2 becomes B times the current I6 flowing through the transistors NW3 and PW1.

FIG. 4 is a graph to explain operation of a transistor in the weak inversion region.

A horizontal axis of FIG. 4 indicates the gate-source voltage Vgs (V), and a vertical axis indicates a LOG value (LogIds) (A) of a current Ids flowing between the drain and the source.

In a strong inversion region where the gate-source voltage Vgs is equal to or larger than a threshold value Vth of the transistor, a drain current Id of the transistor becomes a value represented by the following equation (1).

$$Ids=(½)×\mu×Cox×(W/L)×(Vgs-Vth)^2 \quad (1)$$

Here, $\mu$ is a mobility of electrons in the semiconductor, Cox is a capacitance of the MOS capacitor per unit area, W is a gate width, and L is a gate length.

In the weak inversion region where the gate-source voltage Vgs is equal to or lower than the threshold value Vth of the transistor, the drain-source current Ids of the transistor becomes a value represented by the following equation (2).

$$Ids=I0×\exp(Vgs/\zeta×Vt) \quad (2)$$

Here, I0 is a subthreshold leak current when the gate-source voltage Vgs is zero, ζ (zeta) is a slope coefficient, and Vt is a thermal voltage.

As illustrated in FIG. 4, when the gate-source voltage Vgs (V) is increased, the drain-source current Ids of each of the transistors NW2, NW4, and PW2 that operate in the weak inversion region is exponentially increased.

Accordingly, when the reference voltage VREF and the output voltage VREG are equal to each other, the sources of the respective transistors NW3 and NW4 have the same potential, and the current I7 flowing through the transistors NW4 and PW2 are accordingly B times the current I6.

Further, when the currents I5 and I7 are equal to each other and the reference voltage VREF and the output voltage VREG are equal to each other, the equal current flows through the two differential paths of the differential MOS transistor circuit 101 including the transistors ND1 and ND2, and balance is maintained.

(Operation)

Next, operation of the regulator amplifier circuit 1 when the output voltage VREG is increased or decreased according to increase or decrease of the load current ILOAD is described.

When the load current ILOAD is drastically increased and the output voltage VREG is lowered, the gate voltage of the transistor ND2 is lowered and the current I2 is decreased, which increases the current I1, as with the regulator amplifier circuit 100 of FIG. 1. The increase of the current I1 lowers the drain voltage of the transistor PM1. As a result, the gate voltage ndrv of the transistor PM2 of the active current mirror circuit 102 is lowered. When the gate voltage ndrv of the transistor PM2 is also lowered, the current I2 flowing through the transistor PM2 is increased and the gate voltage ndr of the transistor NB1 is raised, which increases the current flowing through the transistor NB1.

The above-described operation is same as the operation of the above-described regulator amplifier circuit 100; however, in the case of the regulator amplifier circuit 1 of FIG. 3, the source voltage of the transistor NW2 is lowered when the output voltage VREG is lowered.

Since the drain of the transistor NW2 is connected to the connection point P1 of the differential path, the gate-source voltage Vgs of the transistor NW2 is increased and the current I5 flowing through the transistor NW2 is increased when the source voltage of the transistor NW2 is lowered. Since the transistor NW2 operates in the weak inversion region, the current value of the current I5 is largely varied according to the variation of the gate source voltage Vgs of the transistor NW2.

The current I5 is exponentially amplified as represented by the above-described equation (2). Therefore, electric charges are extracted from the gate of the transistor PM2 according to the decrease of the source voltage of the transistor NW2. Note that a portion of the current I5 flows to the output terminal TO and is consumed as the load current ILOAD.

The gate voltage ndrv of the transistor PM2 is lowered faster by the current I5 in addition to the current I3. Therefore, the gate voltage ndr of the transistor NB1 connected to the drain of the transistor PM2 is raised faster as compared with the above-described regulator amplifier circuit 100 illustrated in FIG. 1.

Note that, when the output voltage VREG is lowered, the gate-source voltage Vgs of each of the transistors NW4 and PW2 is decreased. In addition, the transistors NW4 and PW2 operate in the weak inversion region. Therefore, the current I7 is exponentially decreased and the flow of the current I7 is substantially stopped.

As a result, the increase of the current I5 assists the operation of the transistors ND1 and ND2 configuring the differential MOS transistor circuit 101.

FIGS. 5A to 5D are graphs illustrating variation of the output voltage VREG, the current I5, and the current I7 with respect to the step response of the load current ILOAD of the regulator amplifier circuit 1.

When the load current ILOAD is drastically increased and the output voltage VREG is lowered at time t1, the current I5 is steeply increased. The gate voltage ndr of the transistor NB1 is raised faster by the current I5 as compared with the case of the above-described regulator amplifier circuit 100 illustrated in FIG. 1, and the output voltage VREG is raised faster as illustrated by a solid line as compared with the case (illustrated by dashed line) of the above-described regulator amplifier circuit 100 illustrated in FIG. 1.

In contrast, when the load current ILOAD is drastically decreased and the output voltage VREG is raised, the gate voltage of the transistor ND2 is raised and the current I is increased, which decreases the current I1, as with the regulator amplifier circuit 100 of FIG. 1. The increase of the current I2 lowers the drain voltage of the transistor PM2. As a result, the gate voltage ndr of the transistor NB1 is lowered and the current flowing through the transistor NB1 is decreased.

The above-described operation is the same as the operation of the above-described regulator amplifier circuit 100; however, in the case of the regulator amplifier circuit 1 of FIG. 3, the gate voltage of the transistor NW4 is raised when the output voltage VREG is raised.

When the gate voltage of the transistor NW4 is raised, the gate-source voltage Vgs of the transistor PW2 is increased, and the current I7 flowing through the transistor PW2 is increased. Since the transistor PW2 operates in the weak inversion region, the current I7 is largely varied according to the variation of the gate-source voltage Vgs of the transistor PW2.

The current I7 is exponentially amplified as represented by the above-described equation (2). Therefore, electric charges are extracted from the gate voltage ndr of the transistor NB1 according to the increase of the gate-source voltage Vgs of the transistor PW2.

Note that, when the output voltage VREG is raised, the gate-source voltage Vgs of the transistor NW2 is decreased. In addition, the transistor NW2 operates in the weak inversion region. Therefore, the current I5 is exponentially decreased and the flow of the current I5 is substantially stopped.

Accordingly, the increase of the current I7 assists the operation of the transistors ND1 and ND2 configuring the differential MOS transistor circuit 101.

When the load current ILOAD is drastically decreased and the output voltage VREG is drastically raised at time t2 of FIGS. 5A to 5D, the current I7 is steeply increased. The gate voltage ndr of the transistor NB1 is lowered faster by the current I7 as compared with the case of the above-described regulator amplifier circuit 100 illustrated in FIG. 1, and the output voltage VREG is lowered faster as illustrated by a solid line as compared with the case (illustrated by dashed line) of the above-described regulator amplifier circuit 100 illustrated in FIG. 1, because a peak voltage of the output voltage VREG becomes lower.

As described above, the transistor NB1 as the output buffer causes the large load current ILOAD to flow through the transistor NB1. Therefore, even in the case where the transistor NB1 has the large size and the large gate capacitance, it is possible to quickly respond (have high slew rate) to the steep variation of the load current without causing the large amount of current to flow through the differential circuit, in the regulator amplifier circuit 1 of the present embodiment described above.

Further, the current amplification is performed in the transistors NW2 and NW4 only when the reference voltage VREF and the output voltage VREG are different from each other. Therefore, the current consumption is small when the circuit is stabilized, namely, when the reference voltage VREF and the output voltage VREG are equal to each other.

Next, modifications of the above-described embodiment are described. The respective modifications described below are partially modified from the regulator amplifier circuit 1 of the above-described embodiment, and only components different from the components of the above-described embodiment are only described below.

(Modification 1)

Figure 6:
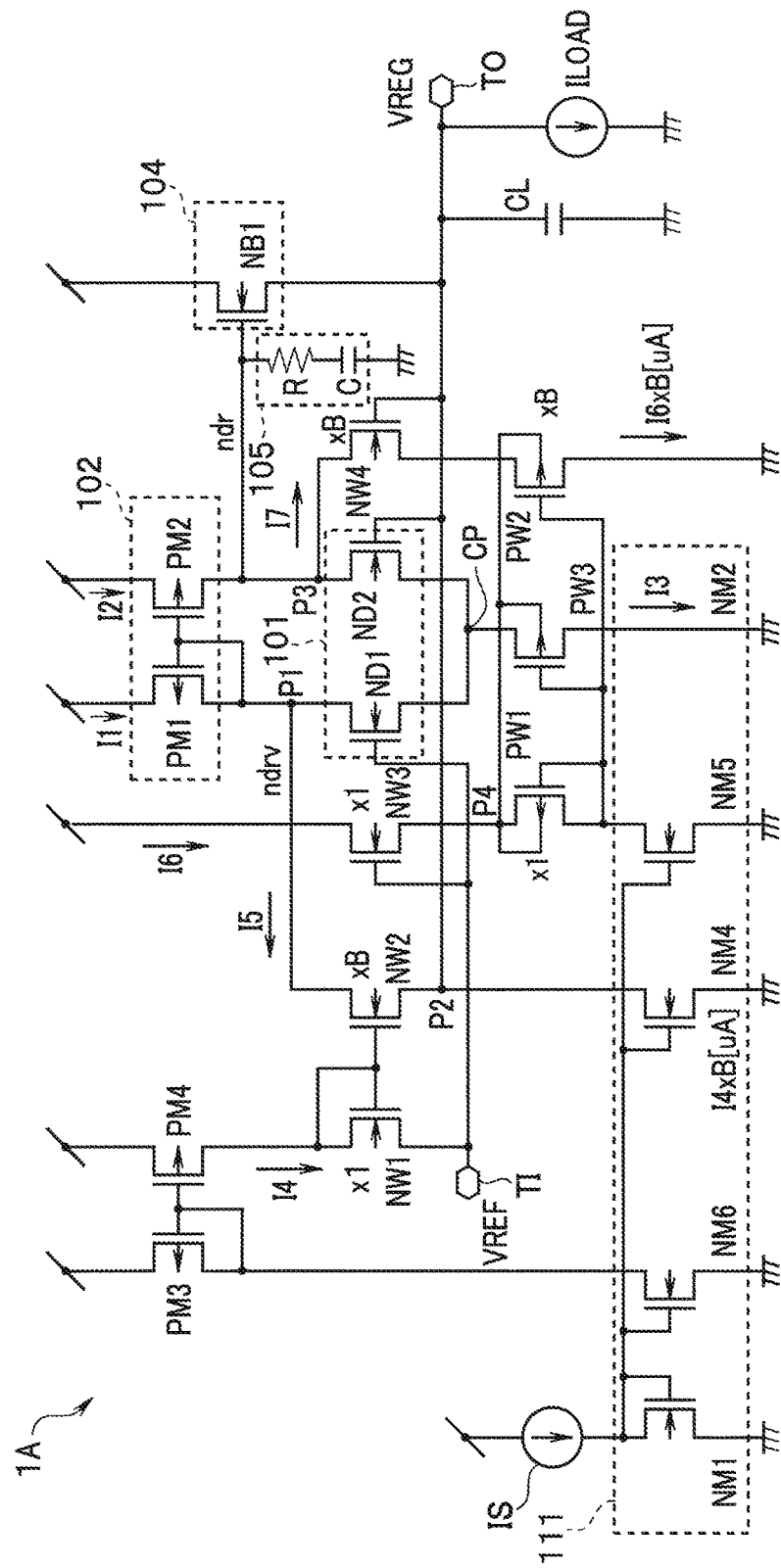
FIG. 6 is a circuit diagram of a regulator amplifier circuit 1A according to a modification 1 of the embodiment.

FIG. 6 is a circuit diagram of a regulator amplifier circuit 1A according to a modification 1.

The regulator amplifier circuit 1A of the modification 1 includes a transistor PW3 that is a pMOS transistor, in order to vary the current I3 according to the output voltage VREG to increase response speed of the differential circuit when the output voltage VREG is raised.

The transistor PW3, which configures a constant current circuit, includes a gate connected to the gate of the transistor PW2, a source connected to the common source of the transistors ND1 and ND2 of the differential MOS transistor circuit 101, a drain connected to a voltage (in this case, ground potential) lower than the voltage of the common source of the differential. MOS transistor circuit 101, and the transistor PW3 operates in the weak inversion region. A body of the transistor PW3 is connected to a connection point P4.

According to the configuration of FIG. 6, when the output voltage VREG is raised, the source potentials of the respective transistors ND1 and ND2 are raised and the current I3 is increased. Accordingly, increasing the current I3 in addition to the increase of the current I7 when the output voltage VREG is raised increases the speed of the operation of the differential circuit.

(Modification 2)

Figure 7:
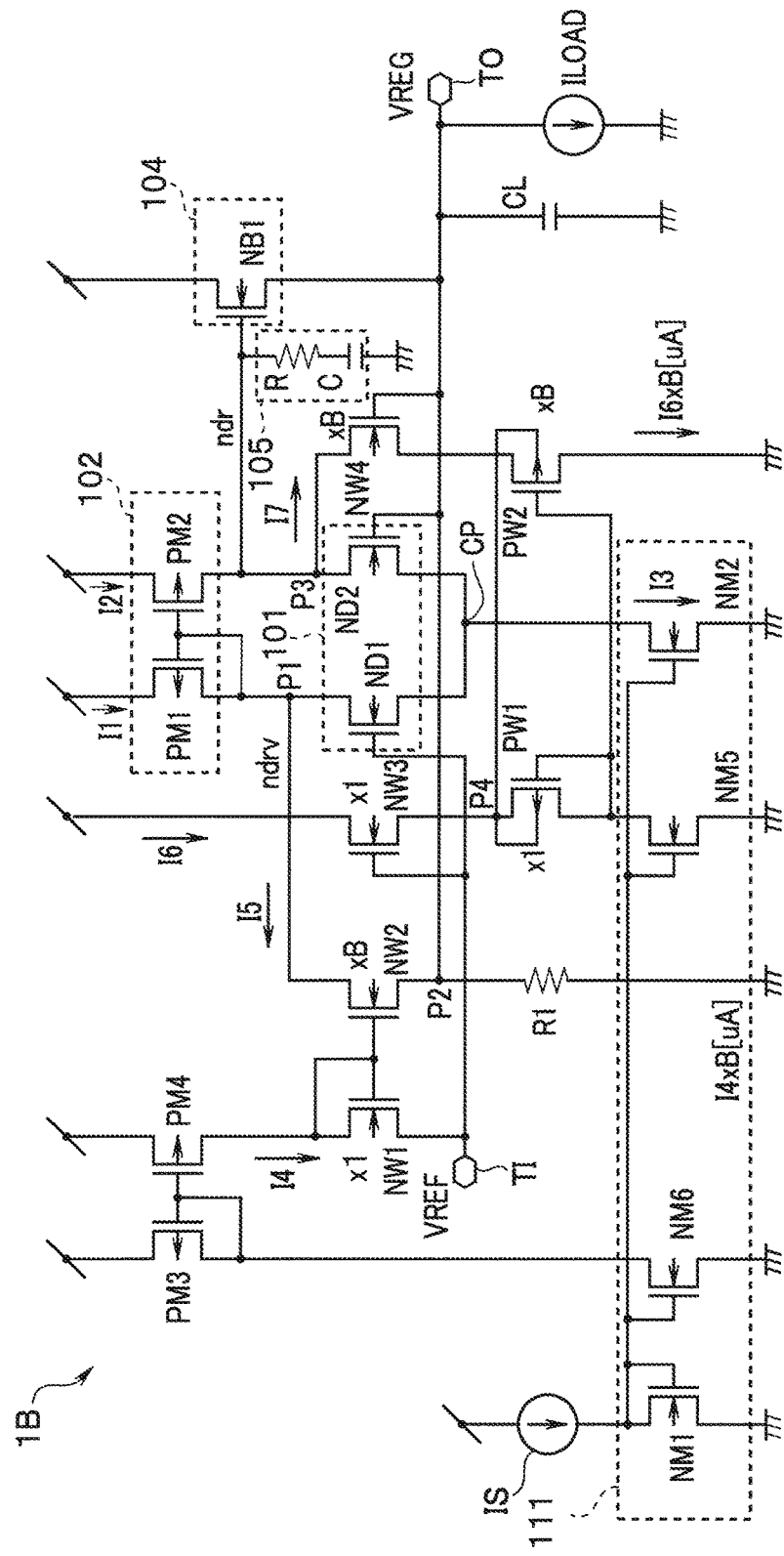
FIG. 7 is a circuit diagram of a regulator amplifier circuit 1B according to a modification 2 of the embodiment.

FIG. 7 is a circuit diagram of a regulator amplifier circuit 1B according to a modification 2.

In the regulator amplifier circuit 1B of the modification 2, the transistor NM4 is replaced with a resistor R1 in order to reduce power consumption when the output voltage VREG is decreased. In other words, the constant current circuit includes the resistor R1.

When the output voltage VREG becomes lower than the reference voltage VREF, the current flowing through the resistor R1 is decreased, which reduces the power consumption of the entire circuit.

As described above, according to the above-described embodiment and modifications, it is possible to achieve the regulator amplifier circuit that makes it possible to quickly respond to the steep variation of the load current without causing the large amount of current to flow through the differential circuit.

While certain embodiments have been described, these embodiments have been presented by Way of example only, and are not intended to limit the scope of the inventions. Indeed, the novel circuits described herein may be embodied in a variety of other forms; furthermore, various omissions, substitutions and changes in the form of the circuits described herein may be made without departing from the spirit of the inventions. The accompanying claims and their equivalents are intended to cover such forms or modifications as would fall within the scope and spirit of the inventions.

What is claimed is:

1. A regulator amplifier circuit, comprising:
a differential amplifier circuit that includes a differential circuit and a third nMOS transistor, and is configured to cause a source potential of the third nMOS transistor to be fed back to minus side of a differential MOS transistor circuit, the differential circuit including the differential MOS transistor circuit, a first current mirror circuit, and a first constant current circuit, the differential MOS transistor circuit including first and second nMOS transistors, the first current mirror circuit being connected to each drain of the first and second nMOS transistors, the first constant current circuit being connected to a common source of the first and second nMOS transistors, and the third nMOS transistor including a gate voltage controlled by the differential circuit;
a fourth nMOS transistor including a drain connected to a drain on plus side of the differential MOS transistor circuit, and a source connected to a source of the third nMOS transistor, the fourth nMOS transistor operating in a weak inversion region;
a second constant current circuit connected to the fourth nMOS transistor to cause a source voltage of the fourth nMOS transistor to be equal to or substantially equal to a gate voltage on the plus side of the differential MOS transistor circuit;
a fifth nMOS transistor including a drain connected to a drain on the minus side of the differential MOS transistor circuit, and a gate connected to the source of the third nMOS transistor, the fifth nMOS transistor operating in the weak inversion region; and
a first pMOS transistor including a source connected to a source of the fifth nMOS transistor, and a drain connected to a voltage lower than a source voltage of the fifth nMOS transistor, the first pMOS transistor operating in the weak inversion region.

2. The regulator amplifier circuit according to claim 1, comprising a second current mirror circuit connected to the source of the fifth nMOS transistor, the second current mirror circuit including the first pMOS transistor and a second pMOS transistor including a gate connected to a gate of the first pMOS transistor.

3. The regulator amplifier circuit according to claim 2, wherein the first constant current circuit includes a third pMOS transistor including a gate connected to the gate of the first pMOS transistor, a source connected to the common source of the differential MOS transistor circuit, and a drain connected to a voltage lower than a voltage of the common source of the differential MOS transistor circuit, the third pMOS transistor operating in the weak inversion region.

4. The regulator amplifier circuit according to claim 2, wherein the second constant current circuit includes a resistor.

5. The regulator amplifier circuit according to claim 1, wherein the first constant current circuit includes a third pMOS transistor including a gate connected to a gate of the first pMOS transistor, a source connected to the common source of the differential MOS transistor circuit, and a drain connected to a voltage lower than a voltage of the common source of the differential MOS transistor circuit, the third pMOS transistor operating in the weak inversion region.

6. The regulator amplifier circuit according to claim 1, wherein the second constant current circuit includes a resistor.

7. The regulator amplifier circuit according to claim 1, wherein
one of the first and second nMOS transistors is provided with a reference voltage, and
another of the first and second nMOS transistors outputs an output voltage.

8. The regulator amplifier circuit according to claim 7, wherein the other of the first and second nMOS transistors is provided with a load current and a load capacitance.

9. The regulator amplifier circuit according to claim 1, further comprising a third current mirror circuit connected to the common source of the first and second nMOS transistors, the third current mirror circuit configuring the first constant current circuit.

10. The regulator amplifier circuit according to claim 9, wherein the third current mirror circuit is connected to a current source.

\* \* \* \* \*